United States Patent [19]

Nishitani

[11] Patent Number: 5,726,466
[45] Date of Patent: Mar. 10, 1998

[54] PRESS PACK POWER SEMICONDUCTOR DEVICE INCORPORATING A PLURALITY OF SEMICONDUCTOR ELEMENTS

[75] Inventor: Kazunobu Nishitani, Yokohama, Japan

[73] Assignee: Kabushiki Kaisha Toshiba, Kawasaki, Japan

[21] Appl. No.: 698,348

[22] Filed: Aug. 15, 1996

[30] Foreign Application Priority Data

Sep. 11, 1995 [JP] Japan .................. 7-232736

[51] Int. Cl.$^6$ .................................. H01L 23/48
[52] U.S. Cl. .................. 257/181; 257/688; 257/689; 257/723
[58] Field of Search .................. 257/688, 723, 257/181, 689

[56] References Cited

U.S. PATENT DOCUMENTS 5,610,439  3/1997  Hiyoshi et al. .............. 257/688

FOREIGN PATENT DOCUMENTS 4-137561  5/1992  Japan .

*Primary Examiner*—Tom Thomas
*Assistant Examiner*—Roy Potter
*Attorney, Agent, or Firm*—Finnegan, Henderson, Farabow, Garrett & Dunner, L.L.P.

[57] ABSTRACT

A press pack power semiconductor device incorporates a number of semiconductor elements. The power semiconductor device has a first insulating frame surrounding each of the semiconductor elements and having a lattice for positioning the semiconductor elements. First and second hard metal electrode plates are provided on the respective sides of each semiconductor element. A first electrode member is in contact with the first hard metal electrode plate. A second insulating frame, having a lattice for positioning the second hard metal electrode plate, is laid on the first insulating frame. A second electrode member is provided. This second electrode member has a lattice-shaped groove in which a lattice-shaped frame portion of the second insulating frame is fitted for positioning.

14 Claims, 8 Drawing Sheets

PRESS PACK POWER SEMICONDUCTOR DEVICE INCORPORATING A PLURALITY OF SEMICONDUCTOR ELEMENTS

BACKGROUND OF THE INVENTION

1. Field of the Invention

The present invention relates to a power semiconductor device which is employed, for example, in a switching circuit of a power converter, and more specifically, to a press pack power semiconductor device incorporating a plurality of semiconductor elements.

2. Description of the Related Art

Jpn. Pat. Appln. KOKAI Publication No. 4-137561 discloses an example of a conventional press pack power semiconductor device incorporating a plurality of semiconductor elements. According to this publication, the semiconductor elements are positioned such that they are spaced from each other by a predetermined distance, and a mold is used for this positioning.

The mold is often referred to as a positioning jig.

The semiconductor devices arranged at their respective positions are encased in a mold for resin formation, and then the mold is filled with resin. In this manner, the semiconductor elements are positioned in a resin frame, with predetermined positional relationships maintained.

According to the publication, the positioning jig (mold) is required, and its use results in a complicated manufacturing process.

In the case of semiconductor elements (e.g., IGBTs) each having gate electrodes, a notch is formed in an external electrode, and the wires for connecting the gate electrodes to the common electrode of control signal lines extend through that notch.

If a plurality of semiconductor elements are arranged within an envelope with high density, it is not easy to neatly arrange the signal lines, particularly when the signal lines are covered with insulating sheaths.

SUMMARY OF THE INVENTION

An object of the present invention is to provide a press pack power semiconductor device incorporating a plurality of semiconductor elements and giving solution to the problems mentioned above, i.e., a press pack power semiconductor device which does not require a positioning jig (mold) for the positioning of the semiconductor elements, which can be easily fabricated, and which enables signal lines with no insulating sheaths to be arranged as neatly as possible.

To attain this object, the present invention provides a press pack power semiconductor device comprising:

a plurality of semiconductor elements arranged in the same plane;

a first insulating frame surrounding each of the semiconductor elements and having a lattice for positioning the semiconductor elements;

first and second hard metal electrode plates provided on respective sides of each of the semiconductor elements;

a first electrode member which is in contact with the first hard metal electrode plate;

a second insulating frame laid on the first insulating frame and having a lattice for positioning the second hard metal electrode plate; and a second electrode member having a lattice-shaped groove in which the second insulating frame is fitted for positioning.

The present invention further provides a press pack power semiconductor device comprising:

a plurality of semiconductor elements arranged in one plane;

a first insulating frame surrounding each of the semiconductor elements and having a lattice for positioning the semiconductor elements;

a first electrode member which is in contact with one side of each of the semiconductor elements;

a second insulating frame having a lattice-shaped frame portion corresponding to a position of each of the semiconductor elements, and an outer frame portion located around the lattice-shaped frame portion, the outer frame portion having an inner periphery which engages with outer portions of the first insulating frame and the first electrode member; and a second electrode member for holding the semiconductor elements in a pressed state.

With this structure, the press pack power semiconductor device of the present invention does not have to employ a positioning jig or mold so as to position the semiconductor elements, and the fabrication process is simplified, accordingly. In addition, the semiconductor elements are positioned by inserting and securing them in the openings which are defined in the first insulating frame and which have stepped sections inside. Hence, the fabrication process is easy and reliable.

The first insulating frame can also be positioned in a reliable manner. That is, the second hard metal electrode plates provided on the first insulating frame are fitted in the openings formed in the second insulating frame. The lattice of the second insulating frame is laid on the first insulating frame, and the inner periphery of the outer frame portion of the second insulating frame engages with the side edges of the first insulating frame, the first hard metal electrode plate, and the first electrode member.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

A description will now be given with reference to the accompanying drawings, as to how the present invention is embodied as a press pack power semiconductor device incorporating a plurality of semiconductor elements.

FIGS. 1 to 7 show a press pack power semiconductor device according to the first embodiment of the present invention. In the power semiconductor device, four diodes 1 (i.e., semiconductor element) are fitted in a first insulating frame 2. The first insulating frame 2 is formed of a heat resistance resin and has a lattice structure. Second hard metal electrode plates 3 are laid on the respective diodes 1.

Figure 1:
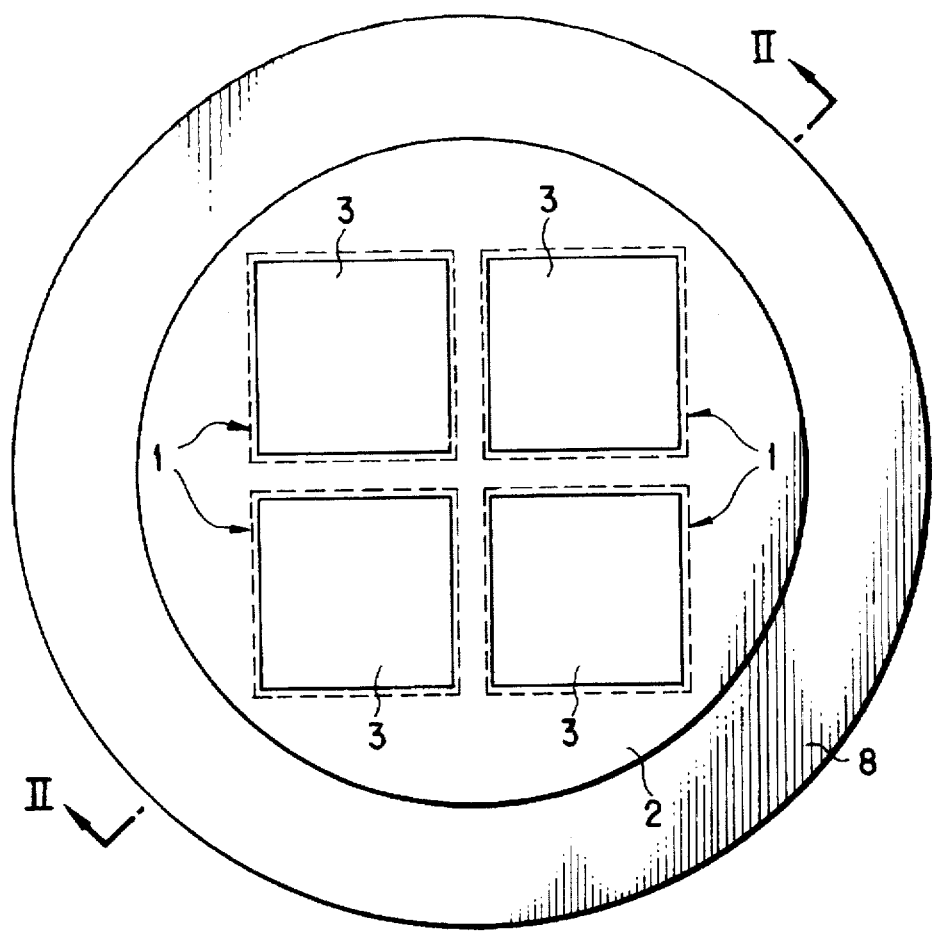
FIG. 1 is a plan view of a press pack power semiconductor device according to the first embodiment of the present invention and shows a state where four diodes are fitted in the first insulating frame and where the second hard metal electrode plates are laid on the respective diodes, the semiconductor device incorporating a combination between a first electrode member provided with a metal ring and a first hard metal electrode plate.

In FIG. 1, a metal ring 8 is depicted. The metal ring 8 connects a first electrode member and a ceramic member (both will be described later) to the outer periphery of the first insulating frame 2.

Figure 2:
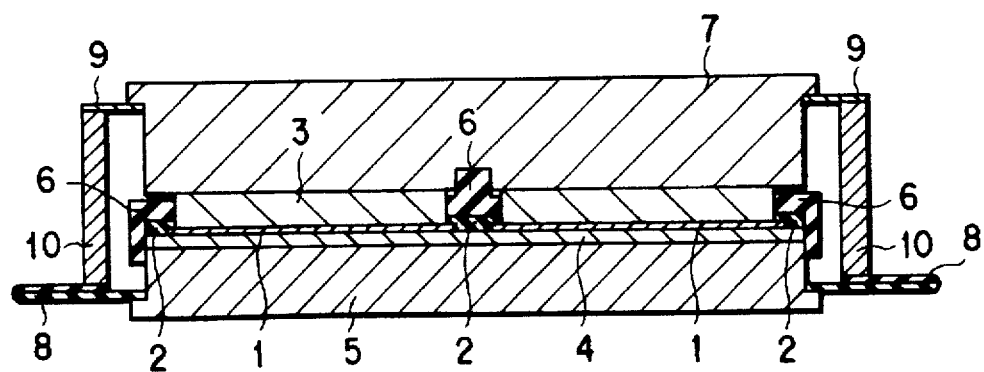
FIG. 2 is a sectional view taken along line II—II in FIG. 1 and showing the subject power semiconductor device, along with its major structural elements.

FIG. 2 is a sectional view taken along line II—II in FIG. 1 and shows the major portion of the subject semiconductor apparatus. As shown in FIG. 2, the semiconductor device comprises a first hard metal electrode plate 4, a first electrode member 5, a second insulating frame 6 formed of a heat resistance resin and having a lattice structure, and a second electrode member 7.

As can be seen from FIG. 2, the first hard metal electrode plate 4 (which is formed of molybdenum, for example) is laid on the first electrode member 5 (which is formed of copper, for example). The first insulating frame 2 holds diodes 1 fitted therein, and is laid on the first hard metal electrode plate 3.

The second hard metal electrode plates 3 are formed of molybdenum, for example, and are laid on the diodes 1 fitted in the lattice-structure first insulating frame 2. The second hard metal electrode plates 3 are positioned by merely fitting them in the openings formed in the second insulating frame 6.

The second insulating frame 6 has an L-shaped cross section, and the inner side face of the skirt portion of the second insulating frame 6 engages with the outer side portions of the first insulating frame 2, first hard metal electrode plate 4, and first electrode member 5. Due to this engagement, the first insulating frame 2, first hard metal electrode plate 4, and first electrode member 5 are secured or made immovable.

The second insulating frame 6 is positioned by fitting its lattice-like frame portion (designated by reference numeral 63 in FIG. 3E) in the lattice-like groove (designated by reference numeral 71 in FIG. 5) of the second electrode member 7.

The first electrode member 5 is coupled to a ceramic member 10 by means of a metal ring 8 which is formed, for example, of an alloy of iron and nickel. Likewise, the second electrode member 7 is coupled to the ceramic member 10 by means of a metal ring 9 which is formed, for example, of the same alloy.

With this structure, the region defined between the metal rings 8 and 9 are hermetically sealed by the ceramic member 10 on the outer side of the first and second electrode members 5 and 7.

Figure 3A:
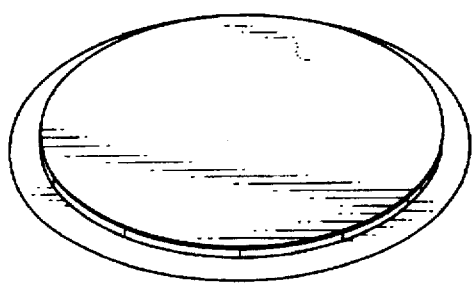
FIGS. 3A to 3F are exploded views of the semiconductor device shown in FIG. 2.

FIGS. 3A to 3F are exploded views showing how the structural components of the subject semiconductor device are assembled. The electrode member 5 shown in FIG. 3A is overlaid with the first hard metal electrode plate 4 shown in FIG. 3B. The first insulating frame 2 shown in FIG. 3C has openings 61 into which semiconductor elements are fitted. Each of the openings 61 is substantially square in shape and has stepped sections inside.

Four diodes 1 are fitted in the respective openings 61 of the first insulating frame 2. Being fitted in the openings 61, the diodes are positioned and secured.

At the time, those surfaces of the diodes 1 which are in contact with the first hard metal electrode plate 4 are in the same plane as that surface of the first insulating frame 2 which is in contact with the first hard metal electrode plate 4.

Figure 3D:
Figure 3B:
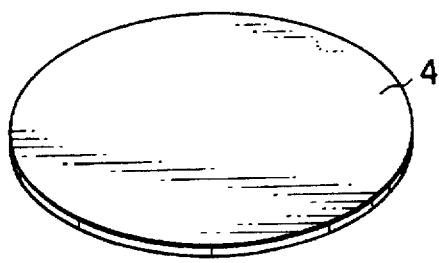
Figure 3E:
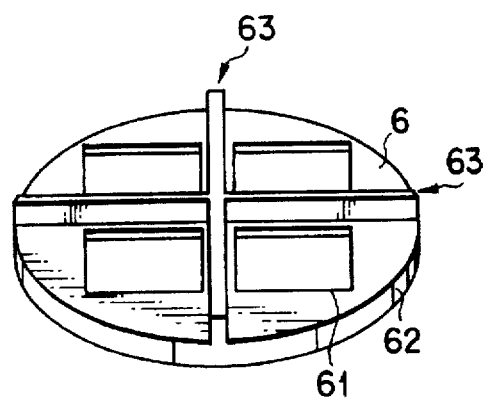
Figure 3C:
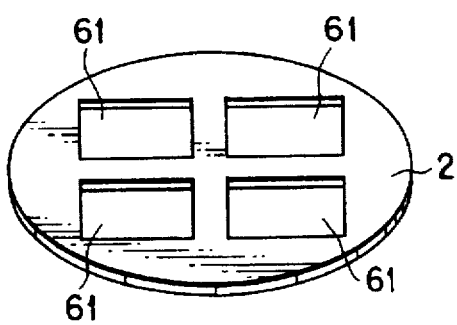

The four second hard metal electrode plates 3 shown in FIG. 3D are laid on the four diodes 1, respectively.

The second hard metal electrode plates 3 are positioned by fitting them in the stepped sections of the openings 61 of the second insulating frame 6 such that they are laid on the diodes 1, respectively.

At the time, the lattice portion-like frame portion of the second insulating frame 6 is in contact with the first insulating frame 2, and the inner side face of the outer frame portion 62 (skirt portion) of the second insulating frame 6 engages with the outer side portions of the first insulating frame 2, first hard metal electrode plate 4, and first electrode member 5.

Figure 4:
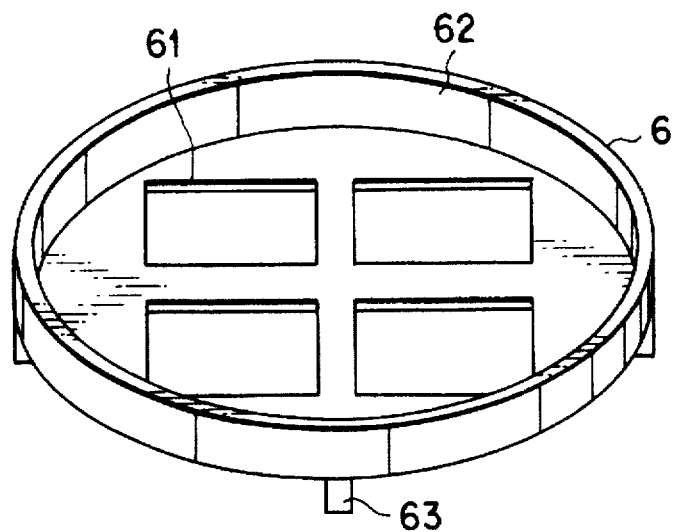
FIG. 4 is a perspective view showing the bottom portion of the second insulating frame depicted in FIG. 3E.

The inside shape of the second insulating frame 6 is shown in FIG. 4.

Figure 3F:
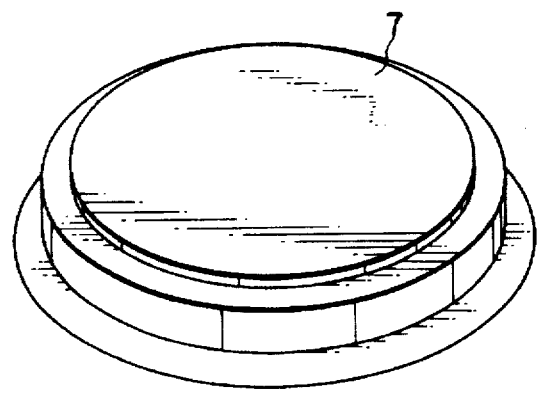

The second insulating frame 6 is positioned and secured by fitting its lattice-like frame portion 63 in the groove 71 (FIG. 5) formed in the inner face of the second electrode member 7 shown in FIG. 3F.

Figure 5:
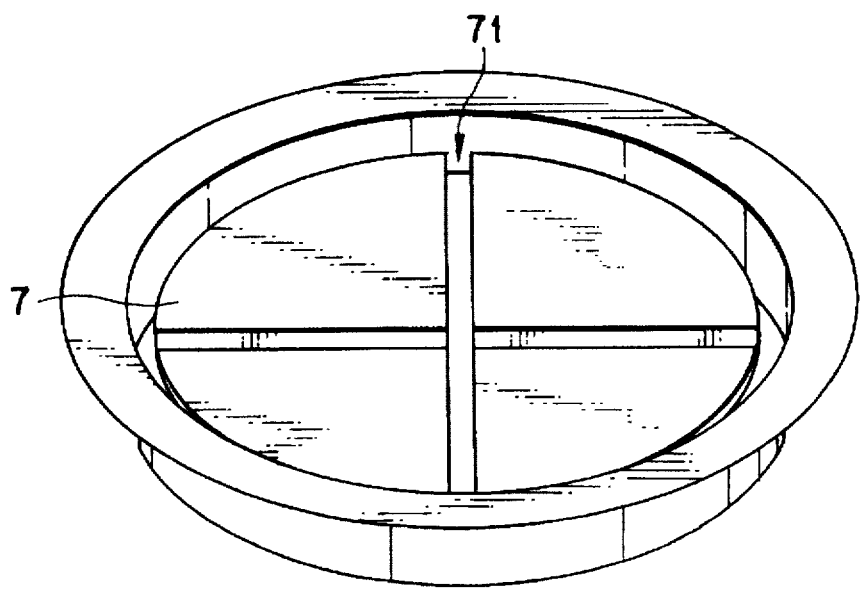
FIG. 5 is a perspective view showing the bottom portion of the second electrode member depicted in FIG. 3F.

The inside shape of the second electrode member 7 (FIG. 3F) is shown in FIG. 5. As is shown, lattice-like grooves 71 are formed in the inner surface thereof.

Figure 6:
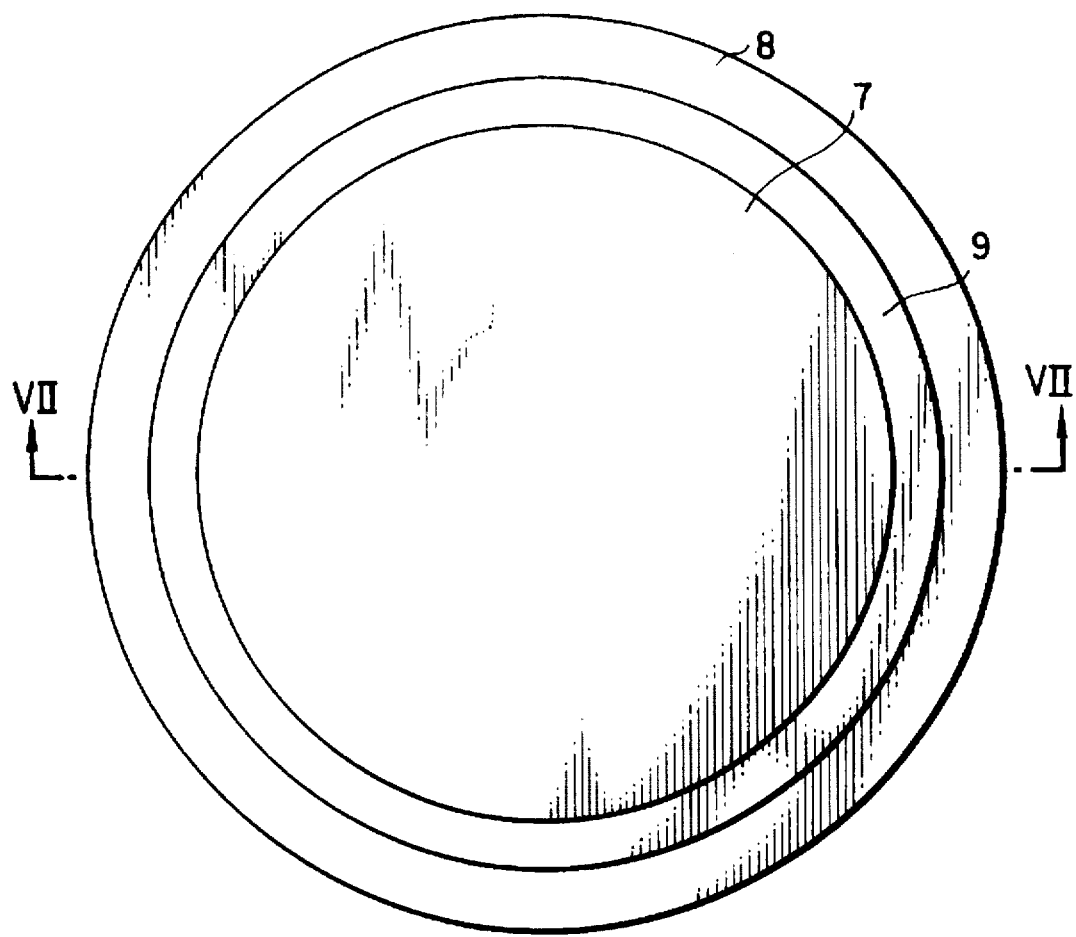
FIG. 6 is a plan view of a semiconductor device fabricated in accordance with the manners shown in FIGS. 1 to 5.
Figure 7:
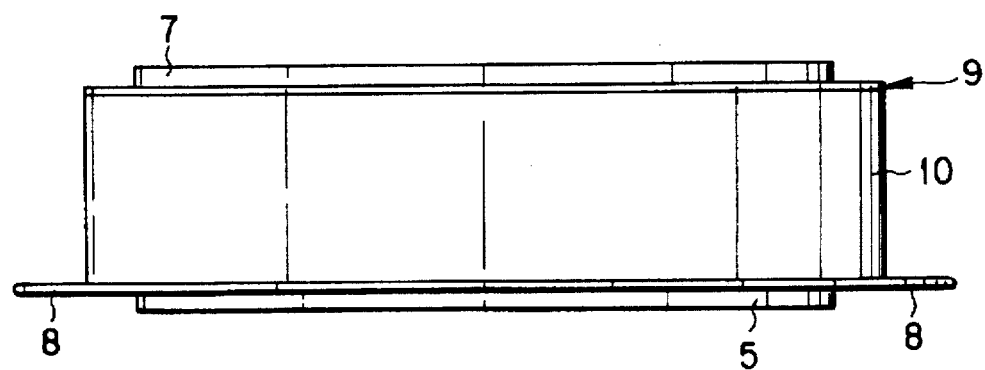
FIG. 7 is a side view of the semiconductor device fabricated in accordance with the manners shown in FIGS. 1 to 5.

The outward appearance of the semiconductor device of the above embodiment can be seen from the plan view shown in FIG. 6 and the side view shown in FIG. 7.

In the plan view in FIG. 6, metal rings 8 and 9 are depicted as being on the outer side of the second electrode member 7. The second electrode member 7 is coupled to the ceramic member 10 by means of metal ring 9, and the first electrode member 5 is coupled to the ceramic plate 10 by means of metal ring 8.

In the side view shown in FIG. 7, metal ring 9 is depicted as being located between the second electrode member 7 and the ceramic member 10, and metal ring 8 is depicted as being located between the first electrode member 5 and the ceramic member 10. By means of these metal rings, the ceramic member 10 is supported.

FIGS. 8 to 15 show a semiconductor device according to the second embodiment of the present invention. In the semiconductor device, the semiconductor elements fitted in a first insulating frame 2 are one diode 1 and three switching elements 11 (e.g., IGBTs) The first insulating frame 2 is formed of a heat resistance resin and has a lattice structure. The diode 1 and semiconductor elements 11 are overlaid with second hard metal electrode plates 3.

Figure 8:
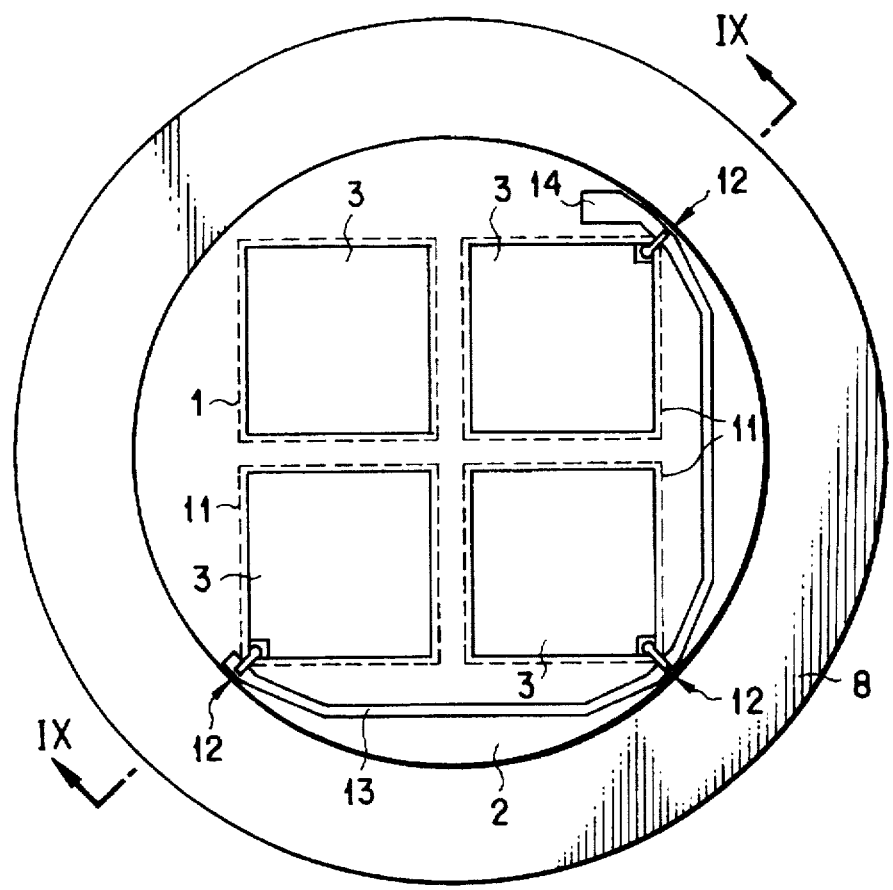
FIG. 8 is a plan view of a press pack power semiconductor device according to the second embodiment of the present invention and shows a state where one diode and three semiconductor elements are fitted in the first insulating frame and where the second hard metal electrode plates are laid on the diode and semiconductor elements.

FIG. 8 shows a metal ring 8 used for coupling the first electrode member 5 (to be mentioned later) and ceramic member 10 (FIG. 9) to the outer periphery of the first insulating frame 2. A conductive signal wire 13 arranged on the first insulating frame 2 is connected to terminal components 12 connected to the gate electrodes of the respective semiconductor elements 11. The conductive signal wire 13 does not have an insulating outer sheath. It is arranged between the first insulating frame 2 and the second insulating frame 6 and electrically connects the electrodes of semiconductor elements to an external gate terminal.

The first and second insulating frames 2 and 6 work as if they were the insulating sheath of the signal wire 13. Hence, the signal wire 13 need not have an outer sheath.

The signal wire 13 connects the gate electrodes of three semiconductor elements 11 to a gate pad 14, through which the gate electrodes are connected to the external gate terminal.

Figure 9:
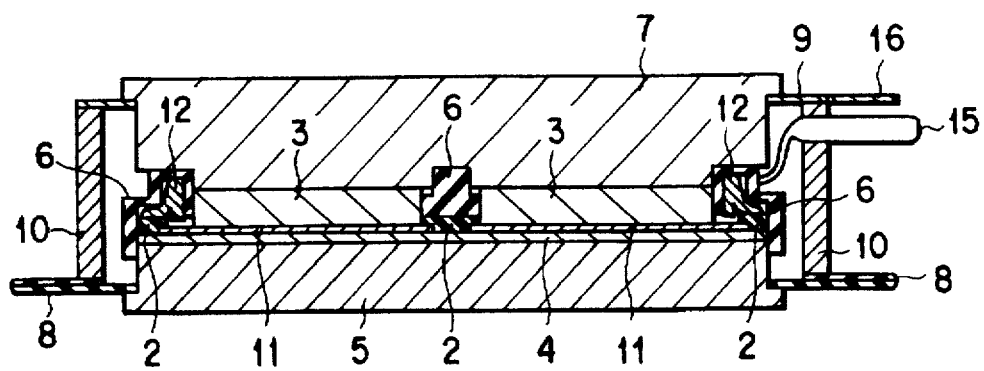
FIG. 9 is a sectional view taken along line IX—IX in FIG. 8. It shows the subject power semiconductor device, along with its major structural elements.

FIG. 9 is a sectional view taken along line IX—IX in FIG. 8. It shows the major portion of the subject power semiconductor device assembled by means of a first hard metal electrode plate 4, a first electrode member 5, a second insulating frame 6 formed of a heat resistance resin and having a lattice structure, and a second electrode member 7. In FIG. 9, switching elements IGBT are depicted as semiconductor elements 11.

The structure shown in FIG. 9 is similar to that shown in FIG. 1, except that it comprises a terminal component 12 for signal wiring (which is required when a signal wire is provided), an external gate terminal 15 (i.e., a control signal terminal) and an auxiliary emitter terminal 16. Hence, reference to the common structural features will be omitted herein.

The first electrode member 5 functions as a collector electrode for switching element IGBT (semiconductor element 11) and functions as a cathode electrode for diode 1.

The second electrode member 7 functions as an emitter electrode for a switching elements IGBT and functions as an anode for diode 1.

Figure 10:
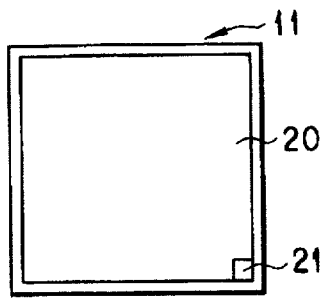
FIG. 10 is a plan view showing the electrode structure of a switching element IGBT, which is a semiconductor element employed in the semiconductor device depicted in FIGS. 8 and 9.

The switching element IGBT shown in FIG. 9 is made up of an emitter electrode 20, and a gate electrode 21 located at one corner of the emitter electrode 20, as can be seen in the plan view shown in FIG. 10.

The gate electrode 21 is electrically connected to the terminal component 12, and further to the signal wire 13 arranged on the first insulating frame 2.

The terminal component 12 for signal wiring is a needle-like metal member having a pressure-generating mechanism employing a spring. The signal wire 13 is formed of copper and has a thickness of 0.5 mm and a width of 3 mm, for example.

FIGS. 11A to 11F are exploded views showing how the structural components of the subject semiconductor device are assembled.

Figure 11A:
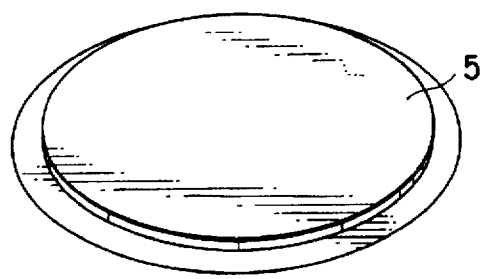
FIGS. 11A to 11F are exploded views of the semiconductor device shown in FIG. 9.
Figure 11D:
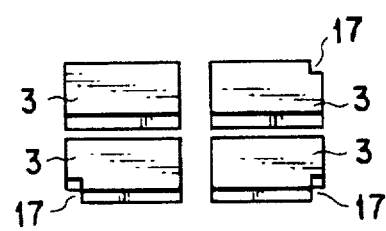
Figure 11B:
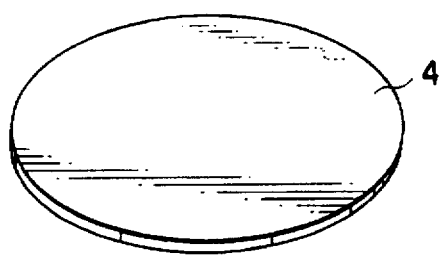

The first electrode member 5 shown in FIG. 11A is overlaid with the first hard metal electrode plate 4 shown in FIG. 11B.

Figure 11E:
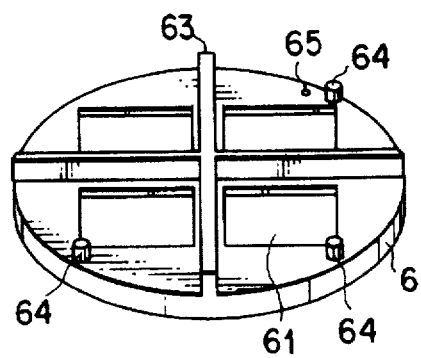
Figure 11C:
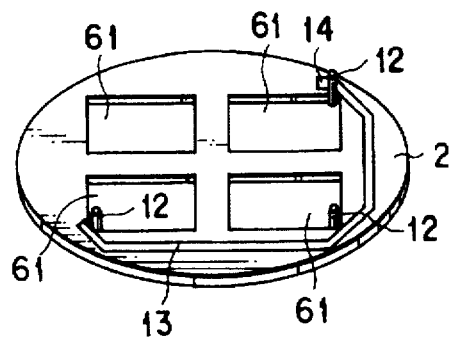
Figure 11F:
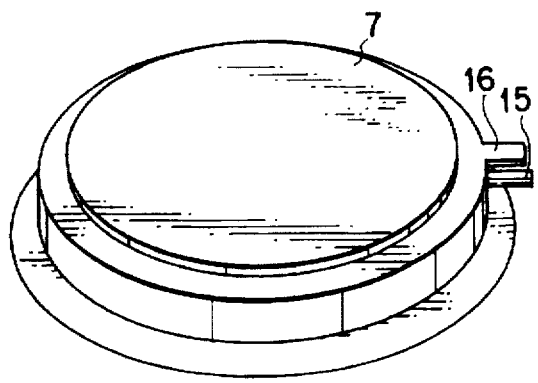

As shown in FIG. 11C, the first insulating frame 2 has openings 61 into which semiconductor elements are fitted. Each of the openings 61 is substantially square in shape and has stepped sections inside.

One diode 1 and three semiconductor elements 11, all of which are shown in FIG. 8, are fitted in the respective openings 61 of the first insulating frame 2. Being fitted in the openings 61, the diode and semiconductor elements are positioned and secured.

The terminal component 12 for signal wiring stands upright at one corner of each of the three semiconductor elements 11, and signal wire 13 is connected to the terminal members 12.

The signal wire 13 connects the gate electrodes of the three semiconductor elements 11 to a gate pad 14, through which the gate electrodes are connected to the external gate terminal shown in FIG. 9.

The second hard metal electrode plates 3 shown in FIG. 11D are laid over the diode 1 and three semiconductor elements 11. Each of the second hard metal electrode plates 3 laid on the three semiconductor elements 11 has a notch 17.

The second hard metal electrode plates 3 are positioned by fitting them in openings 61 formed in the second insulating frame 6 (FIG. 11E). At the time, the lattice portion of the second insulating frame 6 is in contact with the first insulating frame 2, and the inner side face of the outer frame portion (skirt portion) of the second insulating frame 6 engages with the outer side portions of the first insulating frame 2, first hard metal electrode plate 4, and first electrode member 5.

The second insulating frame 6 has three pipe members 64. The three terminal components 12 projecting from the first insulating frame 2 are fitted into the three pipe members 64, for positioning. The second insulating frame 6 also has a hole 65 through which the lead line of the external gate terminal 15 (FIG. 9) is guided to the gate pad 14.

Although not shown, the gate pad 14 and the external gate terminal 15 are electrically connected together by forcibly inserting a terminal member (which is similar to the terminal components 12 mentioned above) inside the second insulating frame 6.

Figure 12:
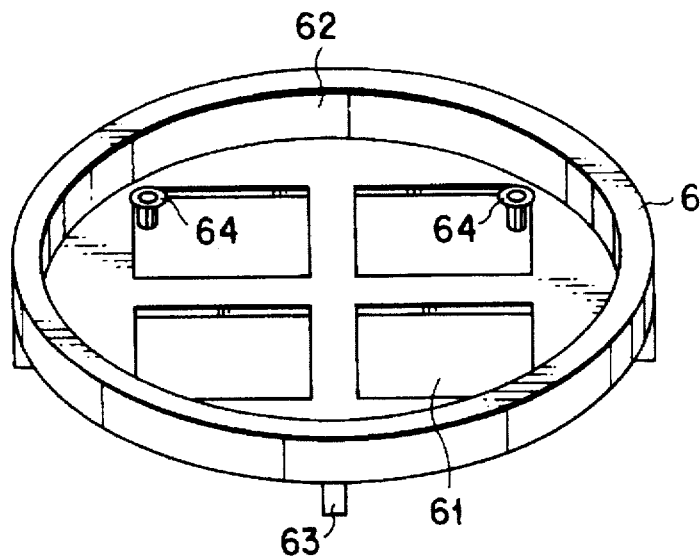
FIG. 12 is a perspective view showing the bottom portion of the second insulating frame depicted in FIG. 11E.

The inside structure of the second insulating frame 6 is shown in FIG. 12.

Figure 13:
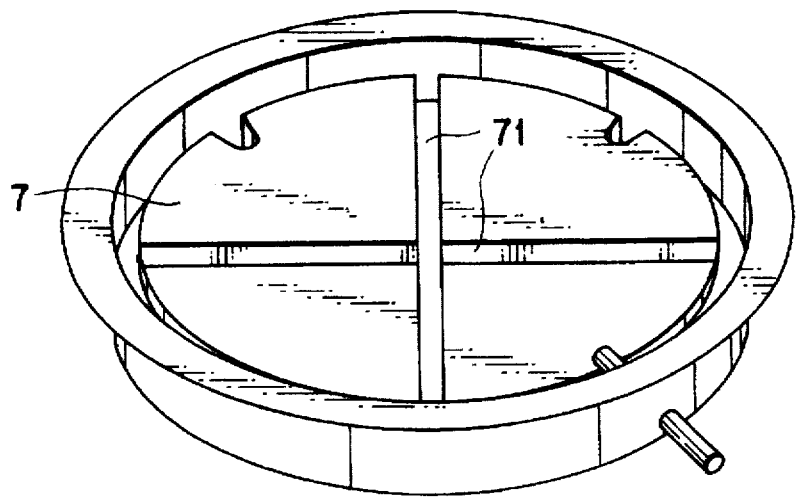
FIG. 13 is a perspective view showing the bottom portion of the second electrode member depicted in FIG. 11F.

The second insulating frame 6 is fitted is secured by fitting its lattice-like frame portion 63 in the lattice-like groove 71 formed in the inner face of the second electrode member 7 shown in FIG. 13.

Figure 14:
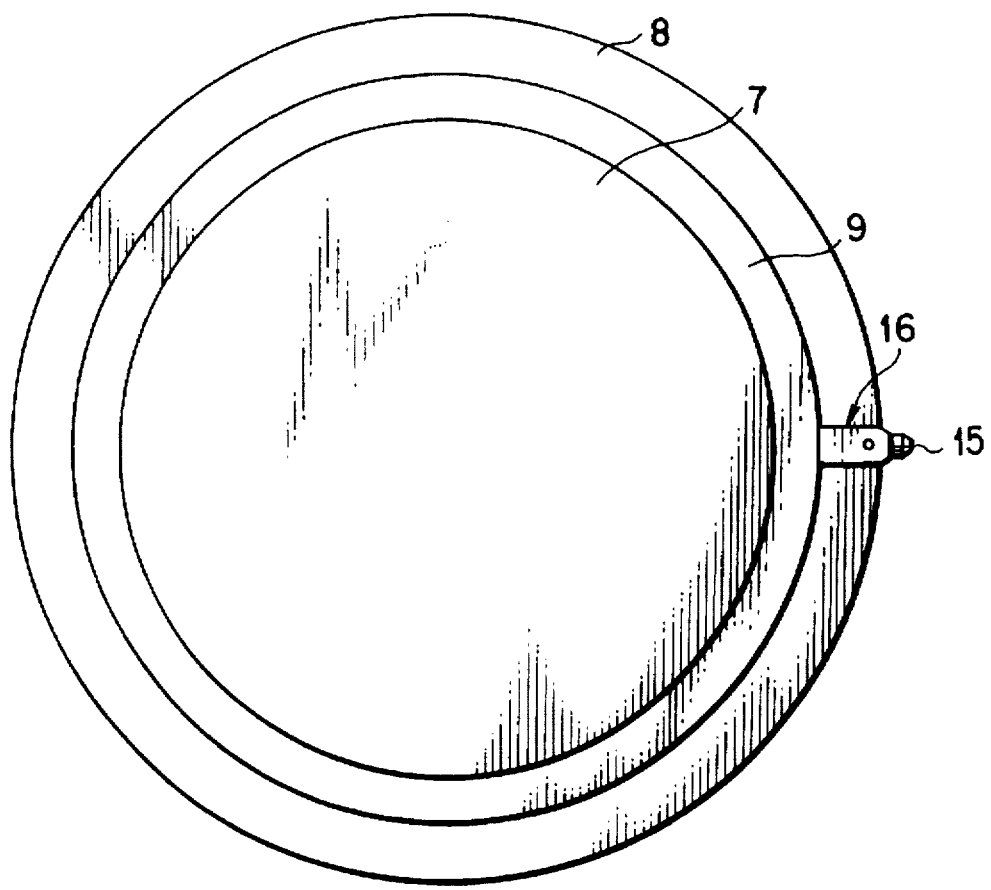
FIG. 14 is a plan view of a semiconductor device fabricated in accordance with the manners shown in FIGS. 8 to 13.
Figure 15:
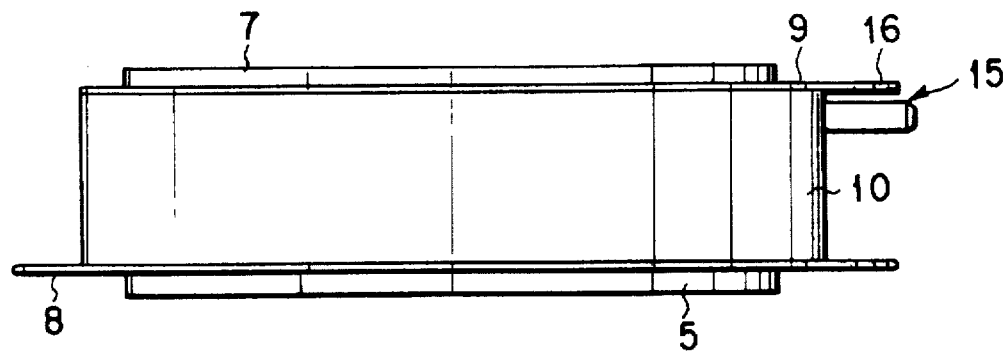
FIG. 15 is a side view of the semiconductor device fabricated in accordance with the manners shown in FIGS. 8 to 13.

The outward appearance of the semiconductor device of the above embodiment can be seen from the plan view shown in FIG. 14 and the side view shown in FIG. 15.

In the plan view in FIG. 14, metal rings 8 and 9 are depicted as being on the outer side of the second electrode member 7. The second electrode member 7 is coupled to the ceramic member 10 by means of metal ring 9, and the first electrode member 5 is coupled to the ceramic plate 10 by means of metal ring 8.

In the plan view in FIG. 14, the gate terminal 15 and the auxiliary emitter terminal 16 are also depicted.

In the side view shown in FIG. 9, metal ring 9 is depicted as being located between the second electrode member 7 and the ceramic member 10, and metal ring 8 is depicted as being located between the first electrode member 5 and the ceramic member 10. In the side view in FIG. 9, the gate terminal 15 and emitter terminal 16 are also depicted.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A press pack power semiconductor device comprising:
   a plurality of semiconductor elements arranged in one plane;
   a first insulating frame surrounding each of the semiconductor elements and having a lattice for positioning the semiconductor elements;
   first and second hard metal electrode plates provided on respective sides of each of the semiconductor elements;
   a first electrode member which is in contact with the first hard metal electrode plate;
   a second insulating frame laid on the first insulating frame and having a lattice for positioning the second hard metal electrode plate; and
   a second electrode member having a lattice-shaped groove in which a lattice-shaped frame portion of the second insulating frame is fitted for positioning.

2. A press pack power semiconductor device according to claim 1, wherein said first insulating frame and said second insulating frame defines a region where a signal wire is arranged, said signal wire electrically connecting electrodes of the semiconductor elements to an external gate terminal and has no insulating outer sheath.

3. A press pack power semiconductor device according to claim 1, wherein said semiconductor elements are switching elements for a power semiconductor device.

4. A press pack power semiconductor device according to claim 1, wherein said second hard metal electrode plate includes a plurality of plate elements corresponding to respective ones of the semiconductor elements, and said plate elements are placed on the respective ones of the semiconductor elements which are positioned in openings defined in the first insulating frame.

5. A press pack power semiconductor device according to claim 1, wherein said second insulating frame has openings defined by a lattice structure, and said second hard metal electrode plate is fitted in the openings.

6. A press pack power semiconductor device according to claim 1, wherein said second insulating frame includes an outer frame portion, and said outer frame portion has an inner periphery which engages with outer portions of the first insulating frame, the first hard metal electrode plate and the first electrode member.

7. A press pack power semiconductor device according to claim 1, wherein said second insulating frame has a lattice frame portion with a projection.

8. A press pack power semiconductor device according to claim 7, wherein said groove of the second electrode member is fitted around the projection of the second insulating frame.

9. A press pack power semiconductor device according to claim 2, wherein said signal wire is arranged on the first insulating frame.

10. A press pack power semiconductor device according to claim 9, wherein said first insulating frame includes a terminal member which is to be electrically connected to a terminal of the semiconductor elements, and said terminal member is electrically connected to the signal wire.

11. A press pack power semiconductor device according to claim 10, wherein said terminal member is a needle-like metal member which has a pressure-generating mechanism employing a spring.

12. A press pack power semiconductor device according to claim 1, wherein said semiconductor elements includes an IGBT and a diode.

13. A press pack power semiconductor device according to claim 1, wherein said first insulating frame includes openings, and each of the openings is surrounded by a frame having step sections in which the semiconductor elements are fitted.

14. A press pack power semiconductor device comprising:
   a plurality of semiconductor elements arranged in one plane;
   a first insulating frame surrounding each of the semiconductor elements and having a lattice for positioning the semiconductor elements;
   a first electrode member which is in contact with one side of each of the semiconductor elements;
   a second insulating frame having a lattice-shaped frame portion corresponding to a position of each of the semiconductor elements, and an outer frame portion located around the lattice-shaped frame portion, said outer frame portion having an inner periphery which engages with outer portions of the first insulating frame and the first electrode member; and
   a second electrode member for holding the semiconductor elements in a pressed state.

* * * * *